United States Patent [19]

Arakawa

[11] Patent Number: 4,703,272

[45] Date of Patent: Oct. 27, 1987

[54] APPARATUS AND METHOD FOR DECOUPLING MRI RF COIL FROM SELECTED BODY PORTIONS USING PASSIVE COMPONENTS

[75] Inventor: Mitsuaki Arakawa, Hillsborough, Calif.

[73] Assignee: The Regents of the University of California, Berkeley, Calif.

[21] Appl. No.: 901,596

[22] Filed: Aug. 29, 1986

[51] Int. Cl.[4] ............................................ G01R 33/20
[52] U.S. Cl. .................................... 324/311; 324/318; 128/653
[58] Field of Search ............... 324/300, 307, 309, 311, 324/318, 321, 322; 128/653

[56] References Cited

U.S. PATENT DOCUMENTS 4,374,360  2/1983  Sepponen ........................ 324/309

Primary Examiner—Michael J. Tokar
Assistant Examiner—Kevin D. O'Shea
Attorney, Agent, or Firm—Nixon & Vanderhye

[57] ABSTRACT

In an MRI system, a passive conductive RF decoupling structure is disposed about a portion of the volume to be imaged but at a location which is proximate a sub-volume from which MRI RF responses are to be suppressed. The passive decoupling structure may be a sheet of conductive material or a shorted loop of conductive material (preferably having a gap in conductivity bridged by RF bypass capacitance so as to suppress lower frequency eddy currents otherwise caused by changing magnetic gradient fields in the MRI system).

8 Claims, 6 Drawing Figures

APPARATUS AND METHOD FOR DECOUPLING MRI RF COIL FROM SELECTED BODY PORTIONS USING PASSIVE COMPONENTS

This invention is related to the field of magnetic resonance imaging (MRI) utilizing nuclear magnetic resonance (NMR) phenomena. It is particularly related to an advantageous arrangement of RF coils (and a related method) for effectively limiting the field of view of an MRI system to a selected, relatively smaller, inner-volume disposed within a human body or other object under examination.

This application is generally related to earlier filed patents and applications of Crooks et al. including U.S. Pat. Nos. 4,297,637; 4,318,043; 4,471,305; 4,599,565; the pending application to Crooks Ser. No. 515,116 filed July 19, 1983 (now U.S. Pat. No. 4,607,225); the pending application to Arakawa et al. Ser. No. 827,609 filed Feb. 10, 1986 (now allowed); the pending application to Harrison et al. Ser. No. 827,638 filed Feb. 10, 1986 (now allowed); the application to Arakawa et al. Ser. No. 888,074 and the application to Fehn et al. Ser. No. 878,369 (now allowed). It is especially related to a copending application of Kaufman et al. Ser. No. 901,594 (now allowed) wherein plural active RF surface coils are utilized for limiting the field of view of an MRI system to a selected, relatively smaller inner volume.

Magnetic resonance imaging (MRI) is now coming into wide-spread commercial usage. Nevertheless, there are still many possible areas for improvement. For example, desired improvements are still sought to improve the signal-to-noise ratio in NMR responses, to minimize motion artifact and to otherwise improve the resulting NMR images.

In some early attempts to achieve magnetic resonance imaging, it was attempted to use highly "focussed" magnetic and/or RF fields so as to achieve NMR coupling to only a single point (i.e., a very small "pixel" or picture element) at one time and then to selectively "scan" such a "sensitive" point volume throughout a larger volume to be imaged. This approach has now been largely (if not entirely) discarded in favor of Fourier Transformation techniques which derive elemental pixel or voxel (i.e., a three-dimensional "pixel" or "point" volume element) NMR measurements which collectively may be arrayed and displayed to produce a magnetic resonance image (MRI) by a complex sequence of signal processing operations performed upon NMR response signals received engross from an entire coupled volume (typically an entire cross-section of a living subject or other object to be imaged).

Unfortunately, when the transmitted and received RF signals are coupled to an entire cross-section of the object to be imaged, the effective signal-to-noise ratio of the resulting image sometimes suffers. In particular, motion artifact or other noise sources potentially associated with areas of the cross-section of no real concern or interest are nevertheless also coupled to the transmitted/received RF signals and thus necessarily and unavoidably contribute to some degradation of the effective signal-to-noise ratio for the derived MRI data used to derive the entire cross-sectional image.

Others have recognized that so-called "surface" RF coils may be employed so as to effectively couple to an image only a selected area of interest—thus avoiding unnecessary possible noise contamination from motion artifact or other noise sources associated with other elements of the object under test. (See, for example, some of the above referenced related applications.)

I have now discovered that it is possible to decouple a selected sub-volume of an imaged cross-section from the imaging process using only passive conductive RF decoupling structures. By placing a conductive sheet or shorted conductive loop proximate the sub-volume for which imaging is to be avoided (e.g., so as to avoid motion artifact or the like), it is possible to substantially suppress MRI RF responses which would otherwise emanate from such a region. Although the exact mechanisms by which such suppression is achieved may not be fully understood, they may include, for example, dissipation of low level RF responses by induced currents into the relatively low impedance path of the shorted loop, conductive sheet, etc. Depending upon the relative disposition of the passive decoupling element and the active RF transmit/receive coil(s), the passive decoupler may also exhibit reflective and/or shielding effects so as to also in these ways effectively decouple a selected sub-volume of the cross-section from the MRI imaging process.

These as well as other objects and advantages of this invention will be more completely understood and appreciated by careful study of the following detailed description of presently preferred exemplary embodiments of this invention, taken in conjunction with the accompanying drawings, of which:

Figure 1:
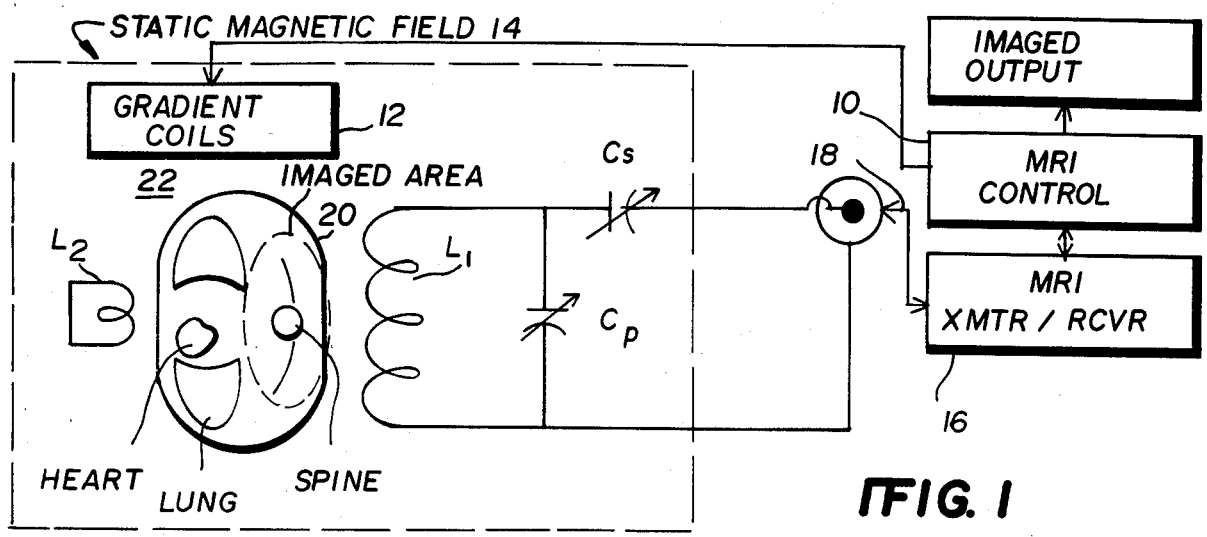
FIG. 1 is a schematic depiction of a magnetic resonance imaging system including a passive conductive RF decoupling structure $L_2$ in accordance with this invention.
Figure 2:
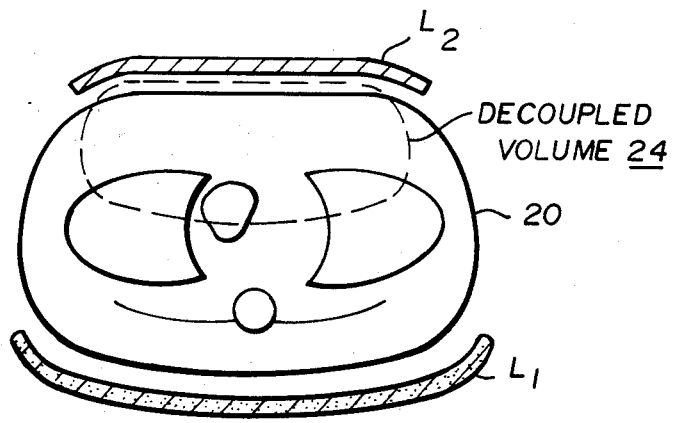
FIG. 2 is a somewhat more realistic, yet still schematic, cross-sectional depiction of a human torso and one possible relative disposition for the active RF coil $L_1$ and the passive decoupling structure $L_2$.
Figure 3:
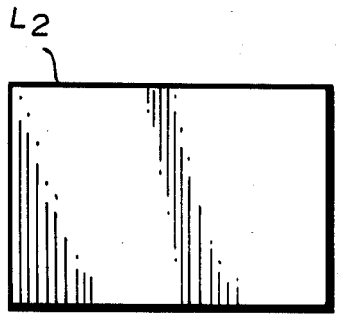
Figure 4:
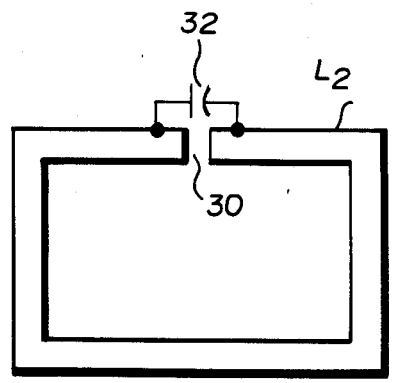
Figure 5:
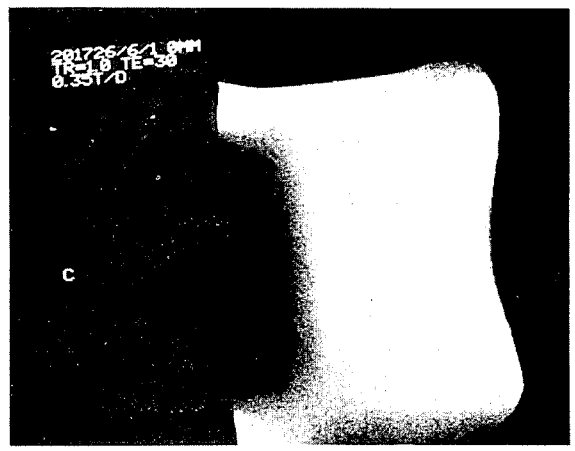
Figure 6:
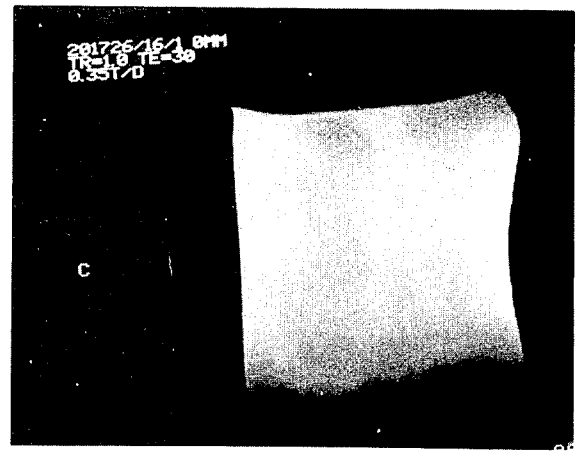

FIGS. 3 and 4 depict exemplary passive decoupling structures which may be used in the embodiment of FIGS. 1 and 2; and FIGS. 5 and 6 are photocopies of comparative MRI imaged outputs of a test specimen both with (FIG. 5) and without (FIG. 6) use of the passive RF decoupling structure shown in FIG. 3.

As earlier mentioned, it is often desirable to reduce motion artifact (e.g., from the abdomen) in MRI imaged outputs by somehow decoupling from the imaging process a selected sub-volume of a cross-section disposed within the MRI apparatus for imaging. The above-referenced related application of Kaufman et al. achieves such decoupling by judicious use of active RF transmit/receive coils. The present invention achieves a degree of decoupling using passive conductive structures.

As depicted in FIG. 1, a typical magnetic resonance imaging (MRI) system includes conventional MRI control circuits 10 which, among other things, control switched gradient coil circuits 12 (which create changing gradients in the static magnetic field 14 at approximately audio frequency rates). In addition, the MRI control circuits 10 control MRI transmitter and receiver circuits 16 which, via transmission line 18, communicate with an active RF coil (or coils as may be the case in quadrature coil detection schemes) $L_1$ (typically via parallel coupling capacitance $C_p$ and one or more series coupling capacitors $C_s$). As also shown in FIG. 1, the active RF coil(s) $L_1$ is (are) disposed within a static magnetic field 14 and also under the influence of changing magnetic gradient coils 12. Furthermore, the active coil(s) $L_1$ partially or completely enclose(s) the cross-section 20 of an object to be imaged (e.g., the human torso) containing anatomical elements such as a spinal column (perhaps of particular interest for imaging purposes) as well as lung and heart tissue (which motion artifact may be associated). Accordingly, for reasons already expressed, it is desirable to limit the actual imaged area 22 to the sub-volume of interest.

In accordance with this invention, at least one passive conductive RF coupling structure $L_2$ is also disposed about a portion of the volume to be imaged—but at a location which is proximate a sub-volume from which MRI RF responses are to be suppressed. In other words, if coupling is desired only to the sub-volume image area 22, then the passive decoupling structure $L_2$ is disposed approximate the remaining sub-volume of the cross-section 20. In the exemplary embodiment, the decoupling structure $L_2$ may be a continuous sheet of conductive material (as depicted in FIG. 3) or an RF-shorted loop of conductive material (as depicted in FIG. 4). The presently preferred exemplary embodiment includes at least one closed loop of conductive material as depicted in FIG. 4 (also preferably including a gap 30 in conductivity which is bridged by an RF coupling capacitance 32 thereby presenting an increased impedance to the passage of lower frequency (e.g., audio) eddy currents otherwise induced into the loop by the changing magnetic gradient fields from controlled gradient coils 20.

As depicted somewhat more realistically (albeit still schematically) at FIG. 2, the passive RF coupling structure $L_2$ may be positioned on one side of the human torso 20 proximate areas of the anatomy which are of no interest (or which may be the source of motion artifact or other noise sources). At the same time, the active RF coil(s) (which may be one or more surface coils thus also inherently providing RF coupling which is somewhat selective of the desired sub-volume 22 for which an image is desired) is (are) located proximate the portion of the anatomy which is actually of interest for imaging purposes. (Of course, as will be appreciated, the active coils may encompass all or substantially all of the cross-sectional volume.) In effect, the passive shorted loop or conductive sheet acts to "short out" RF fields within a decoupled volume 24 (as depicted in FIG. 2) from which it is desired to suppress MRI RF responses.

To demonstrate the invention, a simple copper sheet (15"×12"by 0.005" thick) was placed about a test specimen containing approximately 5 gallons of saline solution. Conventional active quadrature detection RF coils were utilized so as to nominally couple to the entire cross-section and this resulted in an MRI image of the entire cross-section as depicted in FIG. 6 (i.e., a "sagittal" view along a diameter of the 5 gallon cylindrical container and extending axially therealong). However, with the copper sheet in place along one partial circumference of the container, the resulting MRI image was altered as depicted in FIG. 5 so as to effectively exclude a decoupled volume of the cross-section.

In this experiment, the measured signal-to-noise ratio with the decoupling structure present was slightly degraded (16.4 versus 18.1). It is possible that this noted reduction of signal-to-noise ratio may have resulted because the decoupling structure acted to detune slightly the active quadrature detection RF coils used in the experiment. It is believed that further experimentation and adjustment of the entire system should produce MRI imaging capability of the selected sub-volume without substantial inherent degradation in the signal-to-noise ratio due to the decoupling process itself—while at the same time providing potential improvement in effective signal-to-noise ratio due to the fact that the decoupled sub-volume may have contained motion artifact or other noise sources.

While only a few exemplary embodiments of this invention have been described in detail, those skilled in the art will recognize that many variations and modifications may be made in the exemplary embodiment while yet retaining many of the novel features and advantages of this invention. Accordingly, all such modifications and variations are to be included within the scope of the appended claims.

What is claimed is:

1. A magnetic resonance imaging system including RF transmitter and receiver circuits coupled to RF coil circuits located within a static magnetic field having means for producing changing magnetic gradients, said RF coil circuits comprising:
   at least one active RF coil structure connected via transmission line to said RF transmitter and receiver circuits and located about at least a portion of a volume to be imaged and providing MRI RF responses; and
   at least one passive conductive RF decoupling structure also disposed about a portion of said volume but at a location which is proximate a sub-volume thereof from which MRI RF responses are to be suppressed.

2. A magnetic resonance imaging system as in claim 1 wherein said decoupling structure comprises a continuous sheet of conductive material.

3. A magnetic resonance imaging system as in claim 1 wherein said decoupling structure comprises at least one shorted loop of conductive material.

4. A magnetic resonance imaging system as in claim 3 wherein said shorted loop has at least one gap in conductivity which is bridged by RF coupling capacitance which presents an increased impedance to the passage of lower frequency eddy currents otherwise induced into said loop by said changing magnetic gradients.

5. A magnetic resonance imaging method utilizing RF transmitter and receiver circuits coupled to RF coil circuits located within a static magnetic field having changing magnetic gradients, said method comprising:
   locating at least one active RF coil structure, connected via transmission line to said RF transmitter and receiver circuits, about at least a portion of a volume to be imaged and providing MRI RF responses; and
   suppressing MRI RF responses from a selected sub-volume of said volume by locating at least one passive conductive RF decoupling structure about a portion of said volume but at a location which is proximate said sub-volume thereof from which MRI RF responses are to be suppressed.

6. A magnetic resonance imaging method as in claim 5 wherein said decoupling structure comprises a continuous sheet of conductive material.

7. A magnetic resonance imaging method as in claim 5 wherein said decoupling structure comprises at least one shorted loop of conductive material.

8. A magnetic resonance imaging method as in claim 7 wherein said shorted loop has at least one gap in conductivity which is bridged by RF coupling capacitance which presents an increased impedance to the passage of lower frequency eddy currents otherwise induced into said loop by said changing magnetic gradients.

* * * * *